(12) United States Patent
Satoh et al.

(10) Patent No.: US 8,466,726 B2
(45) Date of Patent: *Jun. 18, 2013

(54) DUTY CYCLE CORRECTION SYSTEMS AND METHODS

(75) Inventors: Yasuo Satoh, Ibaraki (JP); Eric Booth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/420,459

(22) Filed: Mar. 14, 2012

(65) Prior Publication Data

US 2012/0218015 A1    Aug. 30, 2012

Related U.S. Application Data

(63) Continuation of application No. 13/098,154, filed on Apr. 29, 2011, now Pat. No. 8,143,928, which is a continuation of application No. 12/400,495, filed on Mar. 9, 2009, now Pat. No. 7,940,103.

(51) Int. Cl.
    *H03K 3/017* (2006.01)
(52) U.S. Cl.
    USPC .......... 327/175; 327/155; 327/158; 327/161; 327/172

(58) Field of Classification Search
    USPC ............ 327/35, 38, 154–156, 158–159, 161, 327/172–176
    See application file for complete search history.

(56) References Cited

U.S. PATENT DOCUMENTS

| | | |
|---|---|---|
| 7,057,431 B2 | 6/2006 | Kwak |
| 7,199,634 B2 | 4/2007 | Cho et al. |
| 7,237,136 B2 | 6/2007 | Li et al. |
| 7,579,890 B2 | 8/2009 | Sohn |
| 7,940,103 B2 | 5/2011 | Satoh et al. |
| 2008/0036517 A1 | 2/2008 | Huang et al. |
| 2008/0169853 A1 | 7/2008 | Park et al. |
| 2010/0225372 A1 | 9/2010 | Satoh et al. |
| 2011/0204948 A1 | 8/2011 | Satoh et al. |

*Primary Examiner* — An Luu
(74) *Attorney, Agent, or Firm* — Dorsey & Whitney LLP

(57) ABSTRACT

Duty cycle correction systems and methods of adjusting duty cycles are provided. One such duty cycle correction system includes a duty cycle adjustor and a variable delay line coupled to the duty cycle adjustor. First and second phase detectors have first inputs coupled to the duty cycle adjustor through an inverter and second inputs coupled to the variable delay line. The phase detectors cause the delay line to align rising or falling edges of signals at the output of the delay line with rising or falling edges, respectively, of signals at the output of the inverter. The controller simultaneously causes the duty cycle adjustor to adjust the duty cycle of the output clock signal until the rising and falling edges of signals at the output of the delay line are aligned with rising and falling edges, respectively, of signals at the output of the inverter.

20 Claims, 7 Drawing Sheets

DUTY CYCLE CORRECTION SYSTEMS AND METHODS

CROSS-REFERENCE TO RELATED APPLICATION

This application is a continuation of U.S. patent application Ser. No. 13/098,154, filed Apr. 29, 2011, U.S. Pat. No. 8,143,928, which is a continuation of U.S. patent application Ser. No. 12/400,495, filed Mar. 9, 2009, U.S. Pat. No. 7,940,103. These applications are incorporated by reference herein in their entirety and for all purposes.

TECHNICAL FIELD

Embodiments of this invention relate to duty cycle correction systems, and, more particularly, in one or more embodiments, to a duty cycle correction system and method having two feedback control circuits.

BACKGROUND OF THE INVENTION

A variety of components are included in integrated circuits that affect the rate at which power is consumed. For example, delay lock loops are often found in memory devices and memory controllers to perform such functions as synchronizing one signal, such as a data strobe signal DQS, to another signal, such as an external clock signal. Conventional delay lock loops traditionally generate a clock signal that can be used to generate a signal, such as a DQS signal, that store data in a latch on each rising edge of the DQS signal. However, more recent memory devices are designed to latch data on both the rising edge of the DQS signal and the falling edge of the DQS signal. While an inverted version of the ClkOut signal could be used to latch data on the falling edge of the ClkOut signal, any deviation of the ClkOut signal from a 50% duty cycle would adversely affect the ability of the DQS signal to latch valid data, particularly with high-speed data transfers insofar as the transitions of the DQS signal should ideally occur at the center of the period that a data bit to be latched is valid.

One approach to providing signals that can be used to latch data on both transitions of a clock signal uses a delay locked loop ("DLL") 10 as shown in FIG. 1. The DLL 10 includes a first variable delay line 14 that receives an input clock signal ClkIn and generates an output clock signal Clk 180 Out as a delayed version of the ClkIn signal. The amount of the delay is determined by a first delay control signal, DelCtrl-1. Similarly, a second variable delay line 16 receives the Clk 180 Out signal and generates an output signal with a delay determined by a second delay control signal, DelCtrl-2. The second variable delay line 16 can be identical to the first variable delay line 14 so that both of the delay lines 14, 16 provide the same delay to the ClkIn signal for the same values of the DelCtrl-1 and DelCtrl-2 signals. The DLL 10 also includes a phase detector 20 and a delay controller 24 coupled to the output of the phase detector 20 for adjusting the delay of the delay lines 14, 16. The phase detector 20 compares the phase of the input clock signal ClkIn to the phase of the signal output from the delay line 16 to generate a phase error signal. The phase error signal is applied to the delay controller 24. The delay controller 24 responds to the phase error signal by adjusting the value of the DelCtrl-1 and DelCtrl-2 signals in a manner that causes the delay lines 14, 16 to reduce the phase error. When the DLL 10 is locked, the signal output from the delay line 16 will have the same phase as the ClkIn signal. In an embodiment where the delay lines 14, 16 are identical to each other and the DelCtrl-1 and DelCtrl-2 signals are identical, the delay line 14 can output a CLK 180 Out signal having a phase that is 180 degrees from the phase of the ClkIn signal. The ClkIn signal, or the signal output from the delay line 16, can then be provided as a Clk 0 Out signal.

In operation, for the DLL 10 to be locked, it would be necessary for the delay lines 14, 16 to collectively delay the Clk 0 signal by 360 degrees. If both delay lines 14, 16 provide the same delay, the rising edge of the Clk 180 Out signal would then be delayed 180 degrees from the rising edge of the Clk 0 signal. As a result, the Clk 0 and Clk 180 Out signals could be used to latch data at the center of respective data valid periods.

Although the DLL 10 may provide improved performance for latching data on both transitions of the ClkIn signal, it nevertheless can suffer from a number of performance limitations. First, since the phase detector 20 determines a phase error only once each period of the ClkIn signal, it can require an undesirably long time for the DLL 10 to achieve a locked condition. Second, the rising edge of the Clk 180 Out signal is not locked to the falling edge of the ClkIn signal. As a result, any difference in the delay of the delay line 14 compared to the delay of the delay line 16 will result in a deviation of the rising edge of the Clk 180 Out signal from 180 degrees.

There is therefore a need for a duty cycle correction system and method that provides faster and more accurate control over the duty cycle of a clock signal.

DETAILED DESCRIPTION

Figure 1:
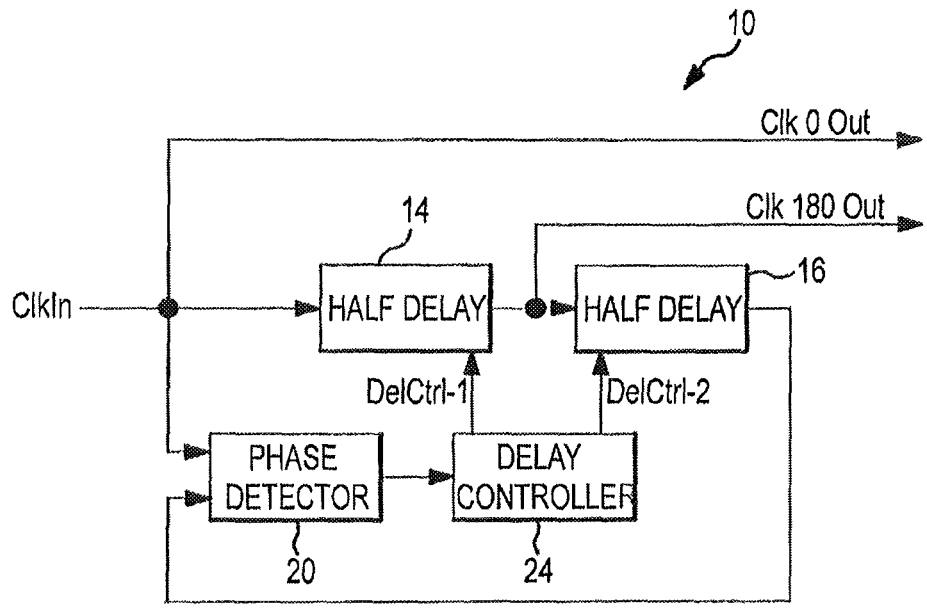
FIG. 1 is a block diagram of a prior art duty cycle correction system.
Figure 2:
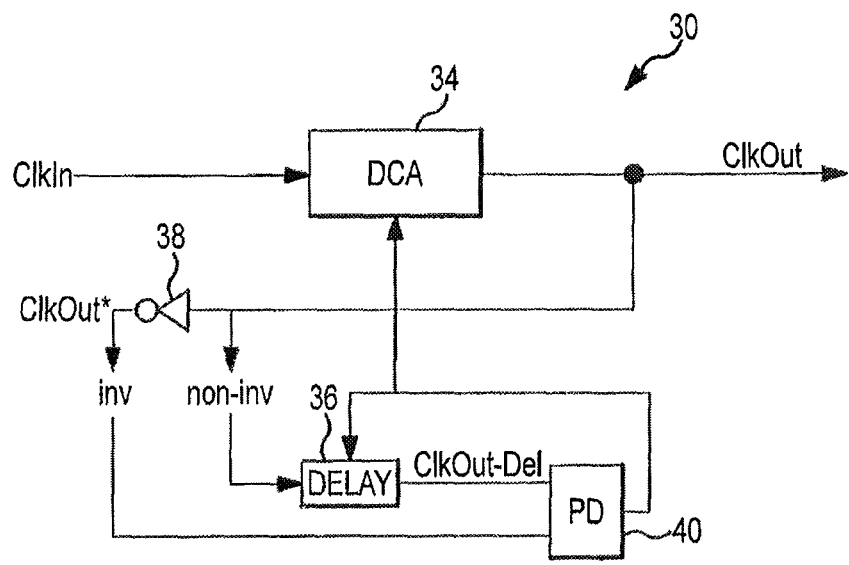
FIG. 2 is a block diagram of a duty cycle correction system according to an embodiment of the invention.

A duty cycle correction system 30 according to an embodiment of the invention is shown FIG. 2. The duty cycle correction system 30 includes a duty cycle adjustor 34 that receives an input clock signal ClkIn and delays either the rising edge of the ClkIn signal or the falling edge of the ClkIn signal to adjust the duty cycle of the ClkIn signal. The duty cycle adjustor 34 generates an output clock signal ClkOut that is applied to both a delay line 36 and an inverter 38. The inverter 38 thus generates the compliment of the ClkOut signal, i.e., ClkOut*. A phase detector 40 compares a specific transition, such as a rising edge, of the delayed ClkOut signal, i.e., the ClkOut-Del signal, with the corresponding transition of the ClkOut*signal. The phase detector 40 then adjusts the delay of the variable delay line 36 so that the compared transitions align with each other. Once the variable delay line 36 has been adjusted to align these transitions, the phase detector 40 compares the other two transitions of the ClkOut-Del signal and the ClkOut*signal. The phase detector 40 then adjusts the duty cycle adjustor 34 until those compared transitions are aligned. At that point, the ClkOut signal will have a 50% duty cycle.

Figure 3:
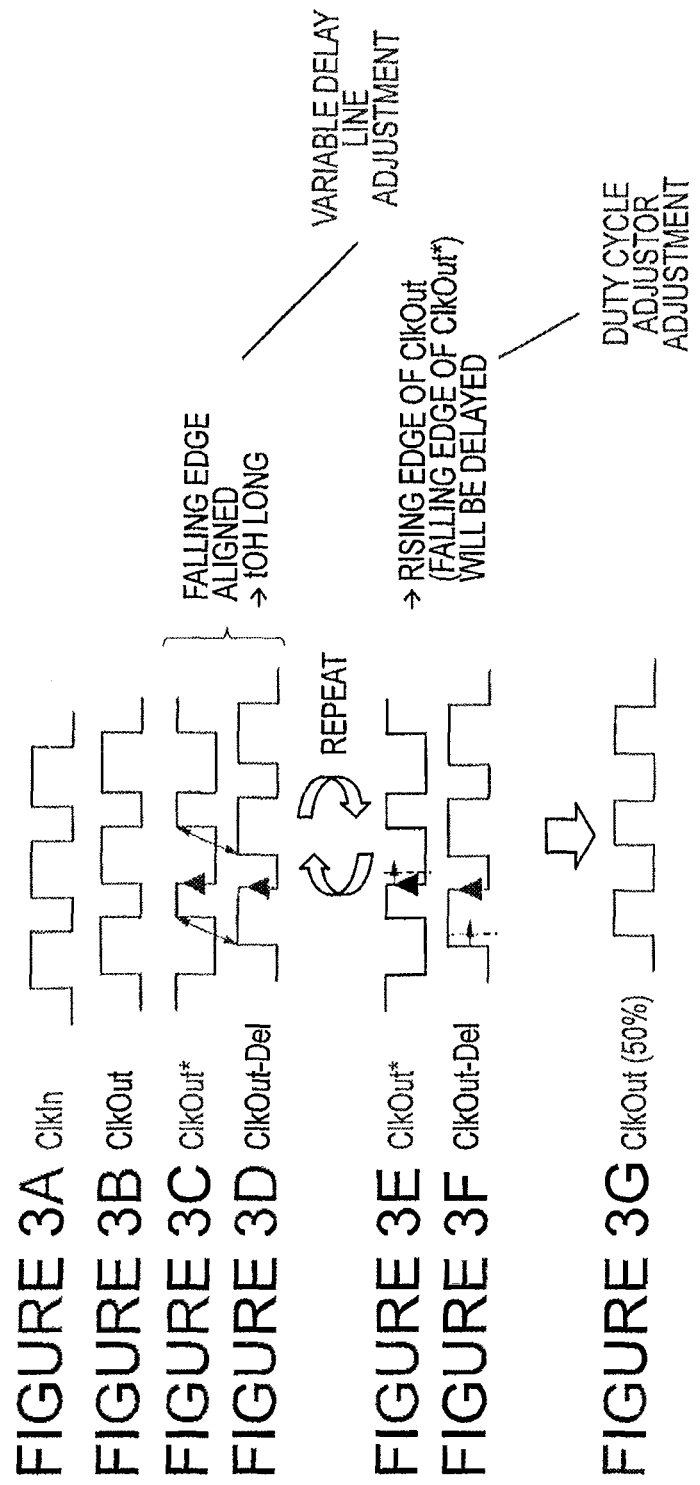
FIGS. 3A-3G is a timing diagram showing some of the signals present in the correction system of FIG. 2.

The general principle of operation of the duty cycle correction system 30 is illustrated in FIG. 3. As shown in FIG. 3A, the ClkIn signal is assumed to initially have a duty cycle that varies substantially from 50%. Therefore, the ClkOut signal at the output of the duty cycle adjustor 34 will also have other than a 50% duty cycle, and it may be somewhat delayed from the ClkIn signal as shown in FIG. 3B. The timing of the rising and falling edges of the ClkOut* signal will then differ substantially from the timing of the rising and falling edges, respectively, of the ClkOut signal if the delay of the delay line 36 is initially minimal. The phase detector 40 compares the rising edges of the ClkOut* and ClkOut-Del signals and it compares the falling edges of the ClkOut* and ClkOut-Del signals to adjust variable delay line 36 until one of the compared rising edges are aligned. As shown in FIGS. 3C and 3D, the delay of the variable delay line 36 has been adjusted so that the falling edges are aligned. The phase detector 40 continues to compare the rising edges of the ClkOut* and ClkOut-Del signals, and it causes the duty cycle adjustor 34 to add delay to the rising edge of the ClkOut signal (i.e., the falling edge of the ClkOut* signal) as shown in FIGS. 3E and 3F. However, as delay is added to the falling edge of the ClkOut* signal, the delay line 36 is adjusted to maintain the falling edges of the ClkOut* and ClkOut-Del signals remain aligned. Thus, both the duty cycle adjustor 34 and the delay line 36 are adjusted until the ClkOut signal has a 50% duty cycle as shown in FIG. 3G.

Figure 4:
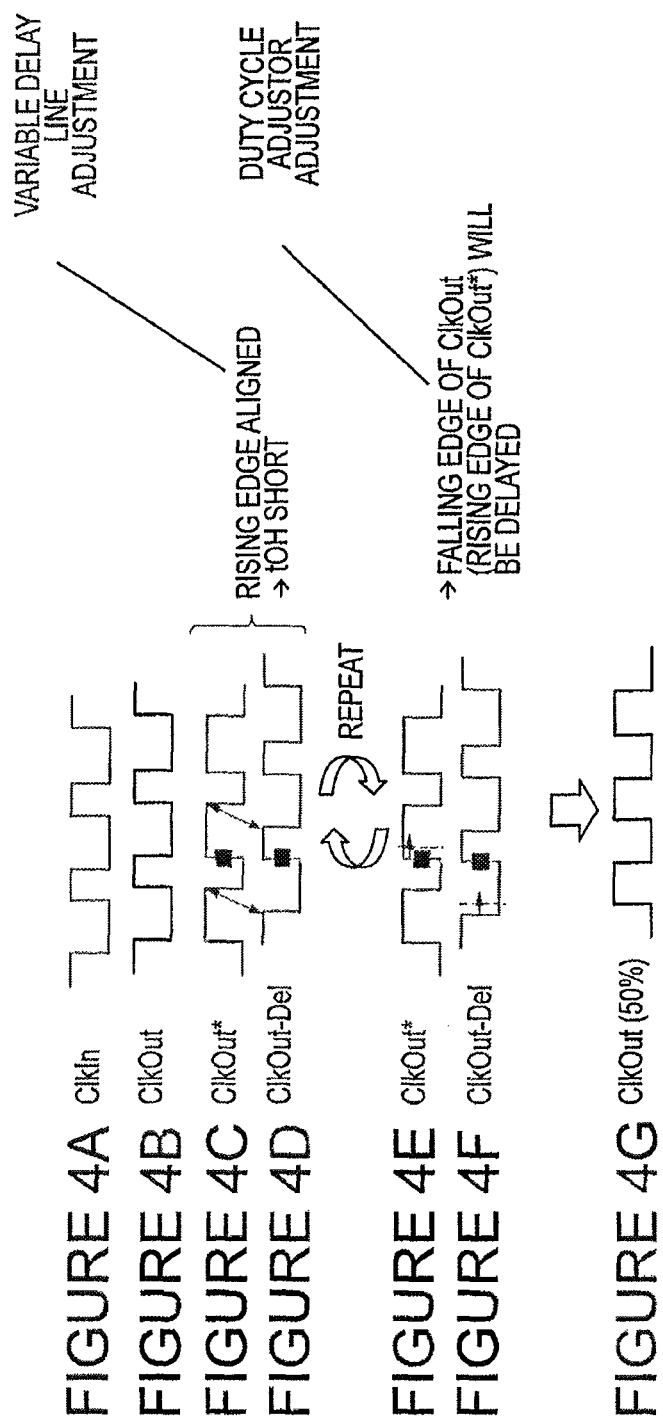
FIGS. 4A-4G is a timing diagram also showing some of the signals present in the correction system of FIG. 2.

The duty cycle correction system 30 operates in substantially the same manner when the ClkIn signal has the duty cycle shown in FIG. 4A to generate the ClkOut signal as shown in FIG. 4B except that the rising edges of the ClkOut* and ClkOut-Del signals become aligned by adjusting the delay line 36, as shown in FIGS. 4C and 4D. Delay is then added to the rising edge of the ClkOut* and ClkOut-Del signals as shown in FIGS. 4E and 4F, respectively, until the duty cycle has been adjusted to 50% as shown in FIG. 4G.

The adjustment process performed by the duty cycle correction system 30 can be summarized as follows:
(a) invert output of duty cycle adjustor 34;
(b) delay output of duty cycle adjustor 34 with variable delay line 36;
(c) compare corresponding transitions of output of variable delay line 36 and inverted output of duty cycle adjustor 34 to adjust variable delay line 36 until compared edges are aligned; and
(d) compare corresponding transitions of output of variable delay line 36 and inverted output of duty cycle adjustor 34 to adjust duty cycle adjustor 34 until compared edges are aligned while adjusting variable delay line 36 to maintain alignment of compared edges.

The adjustment process can, of course, be accomplished in a different manner by different embodiments. For example, rather than inverting the ClkOut signal applied directly to the phase detector 40, the ClkOut signal could be instead inverted before being applied to the variable delay line 36, and the other input to the phase detector 40 could receive the ClkOut signal directly from the output of the duty cycle adjustor 34. Therefore, the above adjustment process can be summarized more broadly as follows:
(a) adjust the delay of ClkOut until either the rising edge of ClkOutDel is aligned with the rising edge of ClkOut* or the falling edge of ClkOutDel is aligned with the falling edge of ClkOut*; and
(b) adjust the duty cycle and delay of the ClkOut signal until the non-aligned transitions of the ClkOut signal are aligned while maintaining the alignment referenced above in (a).

Figure 5:
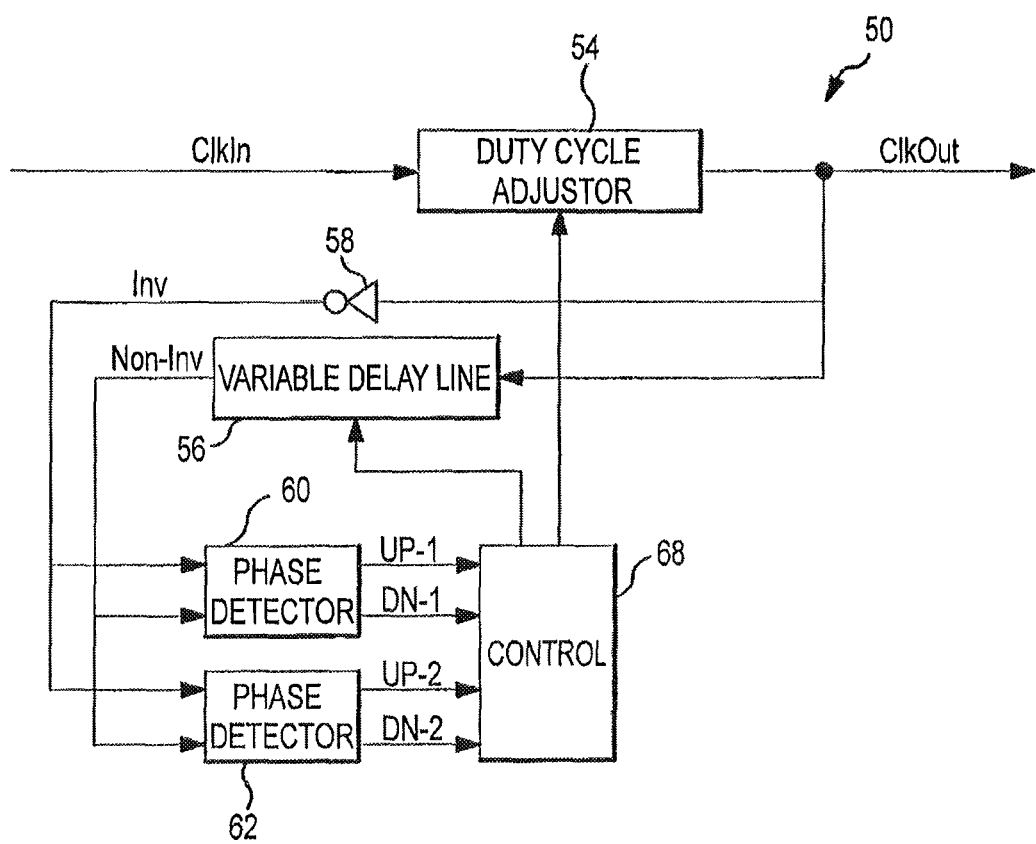
FIG. 5 is a block diagram of a duty cycle correction system according to an embodiment of the invention.

Another embodiment of a duty cycle correction system 50 is shown in FIG. 5. The duty cycle correction system 50 is similar to the duty cycle correction system 30 shown in FIG. 2. Like the duty cycle correction system 30, the duty cycle correction system 50 includes a duty cycle adjustor 54 that receives a ClkIn signal and outputs a ClkOut signal having a duty cycle that may be controlled by a control signal. A variable delay line 56 and an inverter 58 are also coupled to the output of the duty cycle adjustor 54. However, two separate phase detectors 60, 62 are used. The first phase detector 60 has a first input receiving the inverted output from the duty cycle adjustor 54, ClkOut*, and a second input receiving the output of the variable delay line 56, ClkOut-Del. The phase detector 60 applies an UP signal to a controller 68 if the signal at the output of the delay line 56 leads the signal at the output of the inverter 58 by more than a first specific delay. Similarly, the phase detector 60 applies a DN signal to the controller 68 if the signal at the output of the delay line 56 lags the signal at the output of the inverter 58 by more than a second specific delay. If the timing of the signal at the output of the delay line 56 relative to the timing of the signal at the output of the inverter 58 is within a range between the first and second specific delays, neither the UP nor the DN signal is generated. The controller 68 adjusts the delay of the variable delay line 56 responsive to the phase comparison made by the phase detector 60, as explained in greater detail below. Therefore, the variable delay line 56 is adjusted so that the rising edge of the ClkOut-Del signal is aligned to the rising edge of the ClkOut*signal as explained above with reference to FIGS. 2 and 3.

The second phase detector 62 receives the same signals that are received by the first phase detector 60, but it compares edges that are the complement of the edges that are compared by the first phase detector 60. Based on this comparison, the second phase detector 62 selectively applies UP and DN signals to the controller 68. The controller 68 then applies a duty cycle control signal to the duty cycle adjustor 54 that causes the duty cycle of the ClkIn signal to be adjusted until the falling edge of the ClkOut-Del signal is aligned with the falling edge of the ClkOut*signal, as also explained above with reference to FIGS. 2 and 3.

One of the advantages of the duty cycle correction systems 30, 50 shown in FIGS. 2 and 5 is that the respective variable delay lines 36, 56 are not in the path through which the ClkIn signal is coupled to provide the ClkOut signal. As a result, the variable delay lines 36, 56, as well as the phase detectors 40, 60, 62 and controller 68 can be powered down and then periodically powered up to correct the duty cycle of the ClkIn signal. When these other components are powered down, the duty cycle adjustor 54 can still provide a duty cycle-adjusted ClkOut signal.

Figure 6:
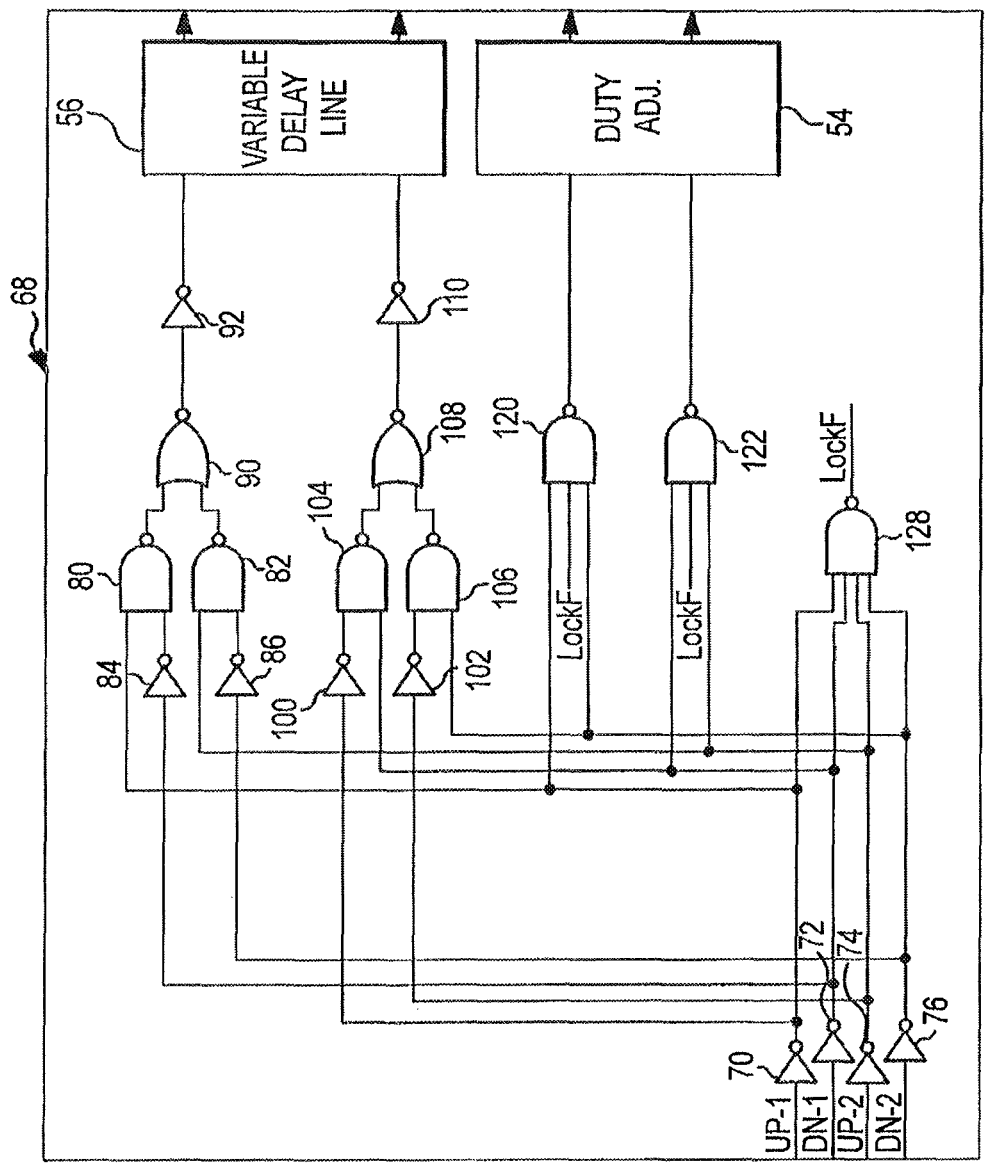
FIG. 6 is a block diagram of a duty cycle controller according to an embodiment of the invention that may be used in the duty cycle correction system of FIGS. 2 and 5 or a duty cycle correction system according to some other embodiment of the invention.

An embodiment of the controller 68 is shown in FIG. 6. The controller 68 decodes the comparisons between the rising and falling edges of the ClkOut*and ClkOut-Del signals to either increase or decrease the delay of the delay line 56 or cause the duty cycle adjustor 54 to increase either the delay of the rising edge or the delay of the falling edge of the ClkIn signal. The phase detector 60 outputs a logic "1" UP1 signal if the rising edge of the ClkOut-Del signal leads the rising edge of the ClkOut*signal. Similarly, phase detector 62 outputs a logic "1" UP2 signal if the falling edge of the ClkOut-Del signal leads the falling edge of the ClkOut* signal. In such case, the signal at the outputs of inverters 70, 74 will be logic "0", and the signals at the outputs of inverters 72, 76 will be logic "1". As a result, NAND gates 80, 82 will be enabled so that the logic "0" signals at the outputs of the inverters 70, 74, after being inverted by inverters 84, 86, cause the NAND gates 80, 82 to each output a logic "0". A NOR gate 90 will therefore output a logic "1" that causes an inverter 92 to output a logic "0," which causes the variable delay line 56 to increase the delay provided by the delay line 56. In the same manner, the phase detectors 60, 62 will output logic "1" DN1 and DN2 signals, which will cause the inverters 70-76 to output logic levels of "0101." As a result, signals applied to inverters 100, 102, NAND gates 104, 106, NOR gate 108 and inverter 110 cause a logic "0" signal to be applied to the variable delay line 56 to decrease the delay provided by the delay line 56.

If the rising edge of the ClkOut-Del signal leads the rising edge of the ClkOut* signal but the falling edge of the ClkOut-Del lags the falling edge of the ClkOut*signal, the phase detector 60 will apply logic "10" signals to the inverters 70, 72, and the phase detector 62 will apply logic "01" signals to the inverters 74, 76. In such case (assuming the LockF signal is high), a NAND gate 120 will apply an active logic "0" signal to a first input of the duty cycle adjustor 54, which causes it to increase the delay of the rising edge of the ClkIn signal. In the same manner, if the rising edge of the ClkOut-Del signal lags the rising edge of the ClkOut* signal but the falling edge of the ClkOut-Del lags the falling edge of the ClkOut*signal, the phase detector 60 will apply logic "01" signals to the inverters 70, 72, and the phase detector 62 will apply logic "10" signals to the inverters 74, 76. In such case (again assuming the LockF signal is high), a NAND gate 122 will apply an active logic "0" signal to the second input of the duty cycle adjustor 54, which causes it to increase the delay of the falling edge of the ClkIn signal. If all of the transitions of the ClkOut-Del signal are aligned with corresponding transitions of the ClkOut*signal, neither the phase detector 60 nor the phase detector 62 will output a logic "1" signal on any of its outputs thereby causing the inverters 70-76 to all output respective logic "1" signals to a NAND gate 128 thereby generating a logic "0" LockF signal. This signal will disable the NAND gates 120, 122 to prevent adjustments of the duty cycle adjustor 54 if all of the transitions of the ClkOut-Del signal are aligned with corresponding edges of the ClkOut* signal.

The operation of the controller 68 is summarized in the following Table A:

TABLE A

| RISING EDGES | FALLING EDGES | DUTY CYCLE ADJUSTMENT |
|---|---|---|
| ClkOut-Del Leads | ClkOut-Del Leads | None |
| ClkOut-Del Leads | ClkOut-Del Lags | Increase Rising Edge |
| ClkOut-Del Leads | Aligned | Increase Rising Edge |
| Aligned | ClkOut-Del Lags | Increase Rising Edge |
| ClkOut-Del Lags | ClkOut-Del Lags | None |
| ClkOut-Del Lags | ClkOut-Del Leads | Increase Falling Edge |
| ClkOut-Del Lags | Aligned | Increase Falling Edge |
| Aligned | ClkOut-Del Leads | Increase Falling Edge |
| Aligned | Aligned | None |

Figure 7:
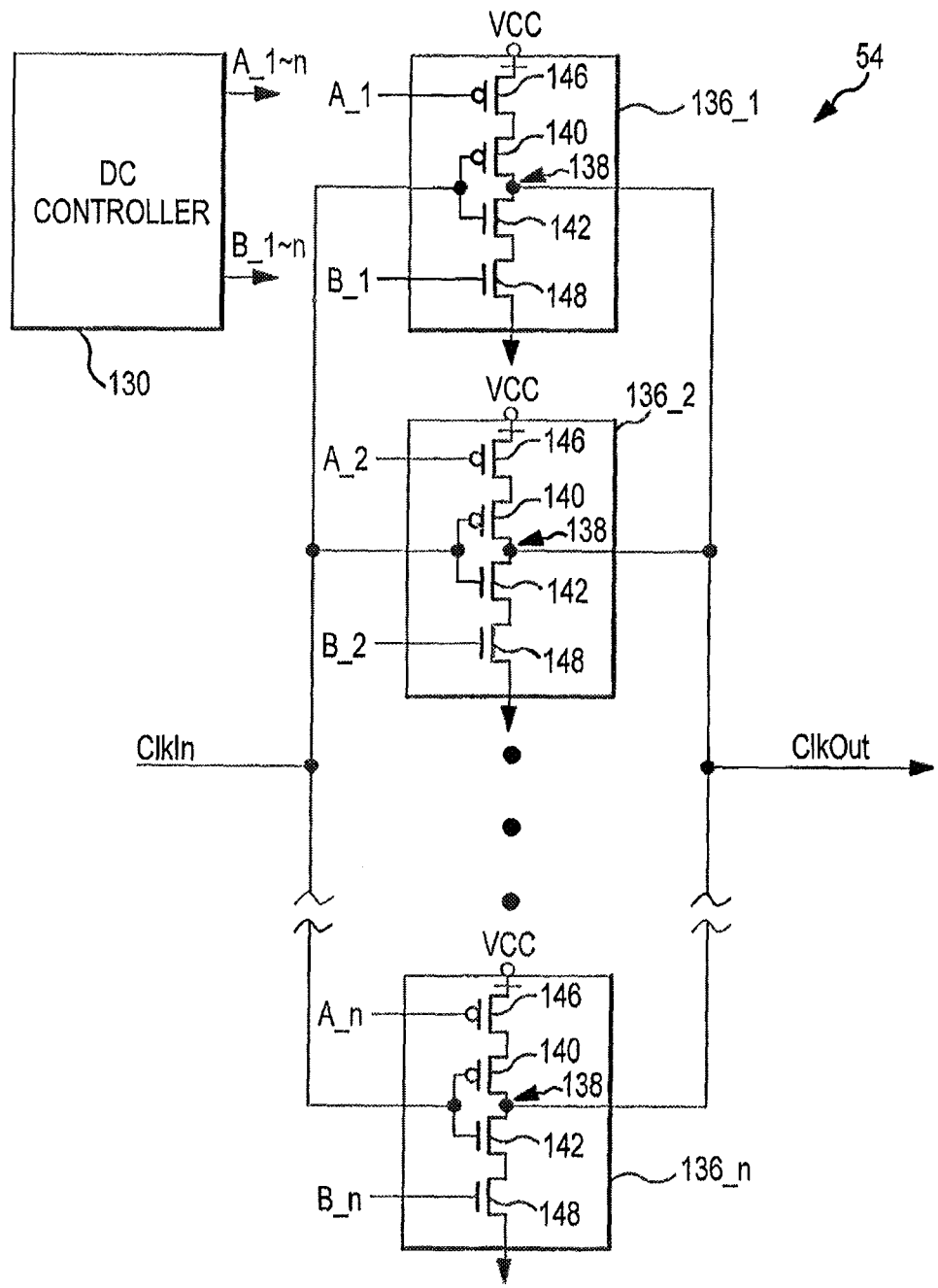
FIG. 7 is a block diagram of a duty cycle adjustor according to an embodiment of the invention that may be used in the duty cycle correction system of FIGS. 2 and 5 or a duty cycle correction system according to some other embodiment of the invention.

An embodiment of the duty cycle adjustor 54 is shown in FIG. 7. The duty cycle adjustor 54 includes a duty cycle controller 130 that is coupled to receive duty cycle commands from the controller 68 (FIG. 4) and applies a respective pair of signals A_1~n,B_1~n to each of a plurality of transition delay circuits 136_1-_n. Each of the transition delay circuits 136 include an inverter 138 formed by a PMOS transistor 140 and an NMOS transistor 142. The gates of the transistors 140, 142 are connected to each other and to a signal input that receives the ClkIn signal. The drains of the transistors 140, 142 are connected to each other and to a signal output that provides the ClkOut signal. The inverter 138 is coupled in series with a PMOS transistor 146 and an NMOS transistor 148. The gate of the PMOS transistor 146 receives the "A" control signal while the gate of the NMOS transistor 148 receives the "B" signal.

In operation, the number of transition delay circuits 136 having their respective "A" signal inputs driven low is increased to turn ON the respective PMOS transistors 146 thereby speeding up the rising edge transitions of the ClkIn signal. Conversely, the number of transition delay circuits having their respective "A" signal inputs driven high is increased to turn OFF the respective PMOS transistors 146 thereby delaying the rising edge transitions of the ClkIn signal. In the same manner, the number of transition delay circuits 136 having their respective "B" signal inputs driven high is increased to turn ON the respective NMOS transistors 148 thereby speeding up the falling edge transitions of the ClkIn signal, and the number of transition delay circuits having their respective "B" signal inputs driven low is increased to turn OFF the respective NMOS transistors 148 thereby delaying the falling edge transitions of the ClkIn signal. Although the embodiment of the duty cycle adjustor 54 shown in FIG. 7 adjusts both the rising and falling edges of the ClkIn signal with the same circuit, other embodiments may adjust the duty cycle in another manner. For example, some embodiments may use two different variable delay lines to implement the duty cycle adjustor 54.

Figure 8:
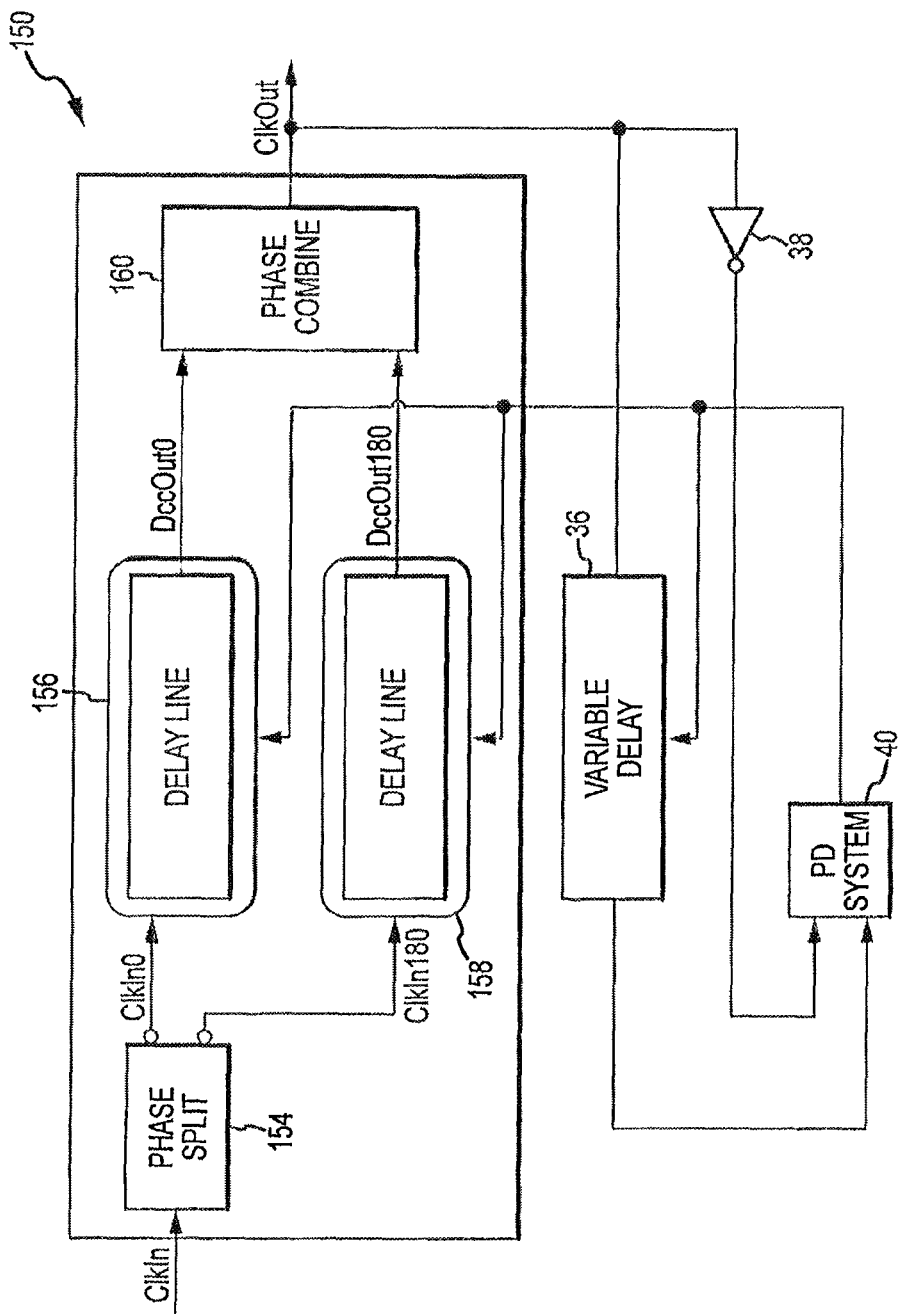
FIG. 8 is a block diagram of a duty cycle correction system according to another embodiment of the invention.

Although the present invention has been described with reference to the disclosed embodiments, persons skilled in the art will recognize that changes may be made in form and detail in other embodiments. For example, although the duty cycle correction systems 30, 50 compare the transitions of the ClkOut* signal with the corresponding transitions of the ClkOut-Del signal, other comparisons can be made. One such comparison would be to compare the transitions of the ClkOut signal with transitions of the ClkOut-Del signal after the ClkOut-Del signal has been inverted. Also, other embodiments of a duty cycle correction system may use other types of duty cycle correct adjustors. For example, FIG. 8 shows an embodiment of a duty cycle correction system 150 in which a duty cycle adjustor is implemented using a phase splitter 154, first and second delay lines 156, 158 and phase combiner 160. The system 150 also uses the components used in the embodiment of FIG. 2, which have been provided with the same references numerals, and, in the interest of brevity, an explanation of their functions will not be repeated.

The phase splitter 154 uses the ClkIn signal to generate a ClkIn0 signal having the same phase as the ClkIn signal and a ClkIn180 signal that is the complement of the ClkIn signal. Of course, if a differential clock signal is applied to the system 150, the phase splitter 154 may be omitted. The delay lines 156, 158 receive the ClkIn0 and ClkIn180 signals, respectively, and generate respective delayed signals DccOut0 and DccOut180. These signals are applied to the phase combiner 160, which generates the ClkOut signal with a rising edge responsive to the rising edge of the DccOut0 signal and a falling edge responsive to the rising edge of the DccOut180 signal.

In operation, the phase detector 40 adjusts the variable delay line 36 and the delay lines 156, 158 so that the rising edge of the inverted ClkOut signal at the output of the inverter 38 is aligned with the rising edge of the delayed ClkOut signal at the output of the variable delay line 36, and the falling edge of the inverted ClkOut signal at the output of the inverter 38 is aligned with the falling edge of the delayed ClkOut signal at the output of the variable delay line 36.

As mentioned above, persons skilled in the art will recognize that changes may be made in form and detail in other embodiments. For example, if a differential output clock is desired, the differential clock signals may be taken from the outputs of the delay lines 156, 158, although the phase combiner 160 may still be used to apply a combined signal to the variable delay line 36 and the inverter 38. Such modifications are well within the skill of those ordinarily skilled in the art. Accordingly, the invention is not limited except as by the appended claims.

We claim:

1. A duty cycle correction system comprising:
   an input configured to receive an input signal;
   a duty cycle adjustor configured to receive the input signal and a control signal and adjust a duty cycle of the input signal in accordance with the control signal to provide an output clock signal;
   a variable delay line configured to receive the output clock signal and delay the output clock signal;
   an inverter configured to receive the output clock signal and invert the output clock signal; and
   circuitry including a phase detector, wherein the circuitry is configured to receive the output clock signal and the inverted output clock signal and generate the control signal based, at least in part, on a phase difference between the output clock signal and the inverted output clock signal.

2. The duty cycle correction system of claim 1 wherein the phase detector is a first phase detector and the first phase detector is configured to provide a first phase signal based at least in part on the phase difference between the output clock signal and the inverted output clock signal, and the duty cycle correction system further comprises:
   a second phase detector configured to receive the output clock signal and the inverted output clock signal and generate a second phase signal based at least in part on a phase difference between the output clock signal and the inverted output clock signal; and
   a controller coupled to the first and second phase detectors and configured provide the control signal based at least in part on the first and second phase signals from the first and second phase detectors.

3. The duty cycle correction system of claim 2 wherein the controller comprises:
   a plurality of inverters, each configured to receive a respective phase signal from the first and second phase detectors and provide inverted respective phase signal; and
   logic circuitry coupled to the plurality of inverters and configured to provide the control signal based on the inverted respective phase signals.

4. The duty cycle correction system of claim 2 wherein the controller is configured to generate the control signal to increase delay of the variable delay line responsive to a transition of the output clock signal leads a corresponding transition of the inverted output clock signal.

5. The duty cycle correction system of claim 2 wherein the controller is configured to generate the control signal to decrease delay of the variable delay line responsive to a transition of the output clock signal lagging a corresponding transition of the inverted output clock signal.

6. The duty cycle correction system of claim 1 wherein the circuitry including the phase detector is configured to generate the control signal to adjust a delay of the variable delay line to align falling transitions of the output clock signal and the inverted output clock signal and to adjust the duty cycle of the input signal by delaying a rising transition of the input signal.

7. The duty cycle correction system of claim 1 wherein the circuitry including the phase detector is configured to generate the control signal to adjust a delay of the variable delay line to align rising transitions of the output clock signal and the inverted output clock signal and to adjust the duty cycle of the input signal by delaying a falling transition of the input signal.

8. A duty cycle correction system, comprising:
   a duty cycle adjustor configured to adjust the timing of a transition of an input clock signal to provide an output clock signal, the adjustment of the timing based at least in part on a control signal;
   circuitry configured to receive the output clock signal and adjustably delay at least one of the output clock signal and an inverted output clock signal, and further configured to compare at least one of corresponding transitions of the output clock signal and inverted output clock signal and provide a control signal based at least in part on the comparison to adjust the timing of a transition of the input signal and adjust the delay between the output clock signal and inverted output clock signal.

9. The duty cycle correction system of claim 8 wherein the duty cycle adjustor is configured to adjust the timing of a transition of an input clock signal by changing the speed of the transition.

10. The duty cycle correction system of claim 8 wherein the duty cycle adjustor comprises:
    a plurality of transition delay circuits each configured to receive a clock signal and respective control signals, and further configured to speed up edge transitions of the clock signal based at least in part on the respective control signals; and
    a duty cycle controller configured to generate the respective control signals according to duty cycle commands.

11. The duty cycle correction system of claim 10 wherein each of the transition delay circuits comprise:
    an inverter having an input configured to receive the clock signal; and
    first and second transistors coupled in series with the inverter and configured to be activated by a respective one of the respective control signals.

12. The duty cycle correction system of claim 8 wherein the duty cycle adjustor comprises:
    first and second delay lines each configured to delay a respective input signal based at least in part on a control signal and provide a respective output signal;
    a phase splitter configured to receive a clock signal and further configured to provide the clock signal to the first delay line and a complement to the clock signal to the second delay line; and
    a phase combiner coupled to the first and second delay lines and configured to combine the respective output signals from the first and second delay lines to provide an output clock signal.

13. A method of duty cycle correction, comprising:
    generating an output clock signal responsive to an input clock signal;

delaying at least one of an output clock signal and an inverted output clock signal;

comparing corresponding transitions of the output clock signal and the inverted output clock signals;

adjusting the delay of the output clock signal and the inverted output clock signal based on comparison of the corresponding transitions; and adjusting a timing of at least one edge of the input clock signal based at least in part on the comparison of the corresponding transitions of the output clock signal and the inverted output clock signal.

14. The method of claim 13 wherein delaying at least one of the output clock signal and the inverted output clock signal comprises:

inverting the output clock signal to provide an inverted output clock signal; and delaying the output clock signal to provide a delayed output clock signal.

15. The method of claim 13 wherein adjusting the delay of the output clock signal and the inverted output clock signal comprises adjusting the delay until at least one of the corresponding transitions of the output clock signal and the inverted output clock signals align.

16. The method of claim 13 wherein adjusting the timing of the at least one edge of the input clock signal comprises adjusting the duty cycle of the output clock signal.

17. The method of claim 16 wherein adjusting the duty cycle of the output clock signal comprises delaying a transition of the input clock signal.

18. The method of claim 17 wherein a rising transition of the input clock signal is further delayed responsive to rising transitions of the output clock signal leading rising transitions of the inverted output clock signal and falling transitions of the output clock signal lagging or aligned with falling transitions of the inverted output clock signal.

19. The method of claim 17 wherein a falling transition of the input clock signal is further delayed responsive to rising transitions of the output clock signal lagging rising transitions of the inverted output clock signal and falling transitions of the output clock signal leading or aligned with falling transitions of the inverted output clock signal.

20. The method of claim 13 wherein delaying at least one of the output clock signal and the inverted output clock signal comprises providing at least one of the output clock signal and the inverted output clock signal to a delay line.

* * * * *